(12) United States Patent
Good

(10) Patent No.: US 11,242,985 B2
(45) Date of Patent: Feb. 8, 2022

(54) LIGHT FIXTURE WITH PATCH PANEL

(71) Applicant: Berk-Tek LLC, New Holland, PA (US)

(72) Inventor: Paul Michael Good, New Holland, PA (US)

(73) Assignee: Berk-Tek LLC, New Holland, PA (US)

( * ) Notice: Subject to any disclaimer, the term of this patent is extended or adjusted under 35 U.S.C. 154(b) by 91 days.

(21) Appl. No.: 16/533,914

(22) Filed: Aug. 7, 2019

(65) Prior Publication Data

US 2021/0041091 A1 Feb. 11, 2021

(51) Int. Cl.
*F21V 23/00* (2015.01)
*F21S 8/02* (2006.01)
*H05K 7/02* (2006.01)
*H05B 47/10* (2020.01)
*H05B 47/19* (2020.01)
*H05K 7/18* (2006.01)

(52) U.S. Cl.
CPC ............ *F21V 23/003* (2013.01); *F21S 8/026* (2013.01); *H05B 47/10* (2020.01); *H05B 47/19* (2020.01); *H05K 7/02* (2013.01); *H05K 7/186* (2013.01)

(58) Field of Classification Search
CPC ........ H05B 47/18; H05B 47/19; H05B 47/10; F21V 23/06; F21V 23/003; F21S 8/046; F21S 8/026; H05K 7/02; H05K 7/186
See application file for complete search history.

(56) References Cited

U.S. PATENT DOCUMENTS

| 8,011,794 | B1* | 9/2011 | Sivertsen | H05B 47/105 |
| | | | | 362/85 |
| 8,558,413 | B1* | 10/2013 | Lepard | H05B 47/18 |
| | | | | 307/150 |
| 8,616,720 | B2* | 12/2013 | Carney | E04B 9/006 |
| | | | | 362/147 |
| 9,307,621 | B1* | 4/2016 | Parello | H05B 45/10 |
| 9,644,828 | B1* | 5/2017 | May | H05B 47/19 |
| 10,091,862 | B2* | 10/2018 | Verbrugh | H05B 47/105 |
| 10,455,654 | B1* | 10/2019 | Andrews | H05B 45/00 |
| 10,721,808 | B2* | 7/2020 | Bowser | H05B 45/10 |
| 2007/0253205 | A1* | 11/2007 | Welker | F21V 21/04 |
| | | | | 362/373 |
| 2016/0165679 | A1* | 6/2016 | Laherty | H05B 45/20 |
| | | | | 315/294 |
| 2017/0023193 | A1* | 1/2017 | Thosteson | F21S 8/061 |
| 2017/0321852 | A1* | 11/2017 | Handsaker | F21V 23/06 |
| 2020/0088393 | A1* | 3/2020 | Laso | F21V 23/06 |

* cited by examiner

*Primary Examiner* — Erin Kryukova
(74) *Attorney, Agent, or Firm* — Sofer & Haroun, LLP

(57) ABSTRACT

A lighting system is provided with a plurality of light fixtures within a room and at least one control system for controlling the plurality of light fixtures within a room. At least one of the light fixtures among the plurality of light fixtures within the room includes a patch panel thereon. The control system is attached to the patch panel on a first side of the patch panel, and a remaining of the plurality of light fixtures in the room are connected to the patch panel on a second side.

2 Claims, 4 Drawing Sheets

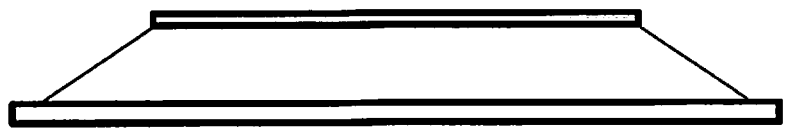
Figure 2A (PRIOR ART - side view)
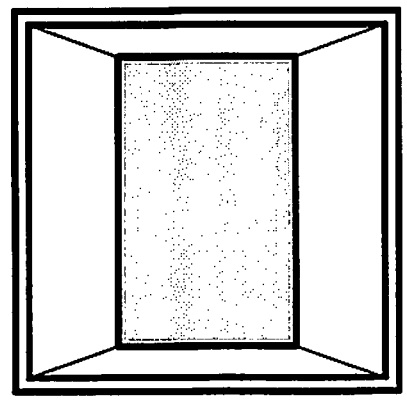
Figure 2B (PRIOR ART - top view)

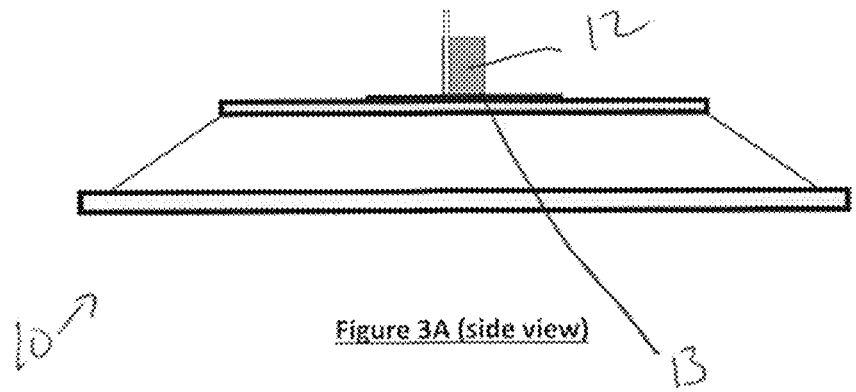
Figure 3A (side view)
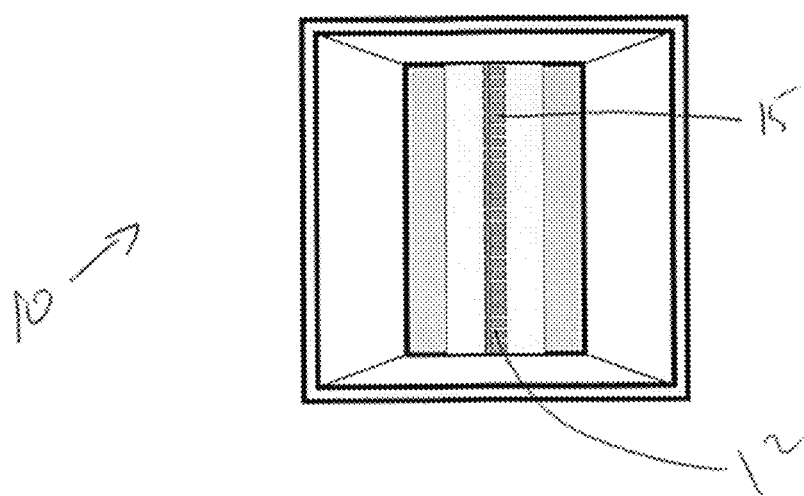
Figure 3B (top view)

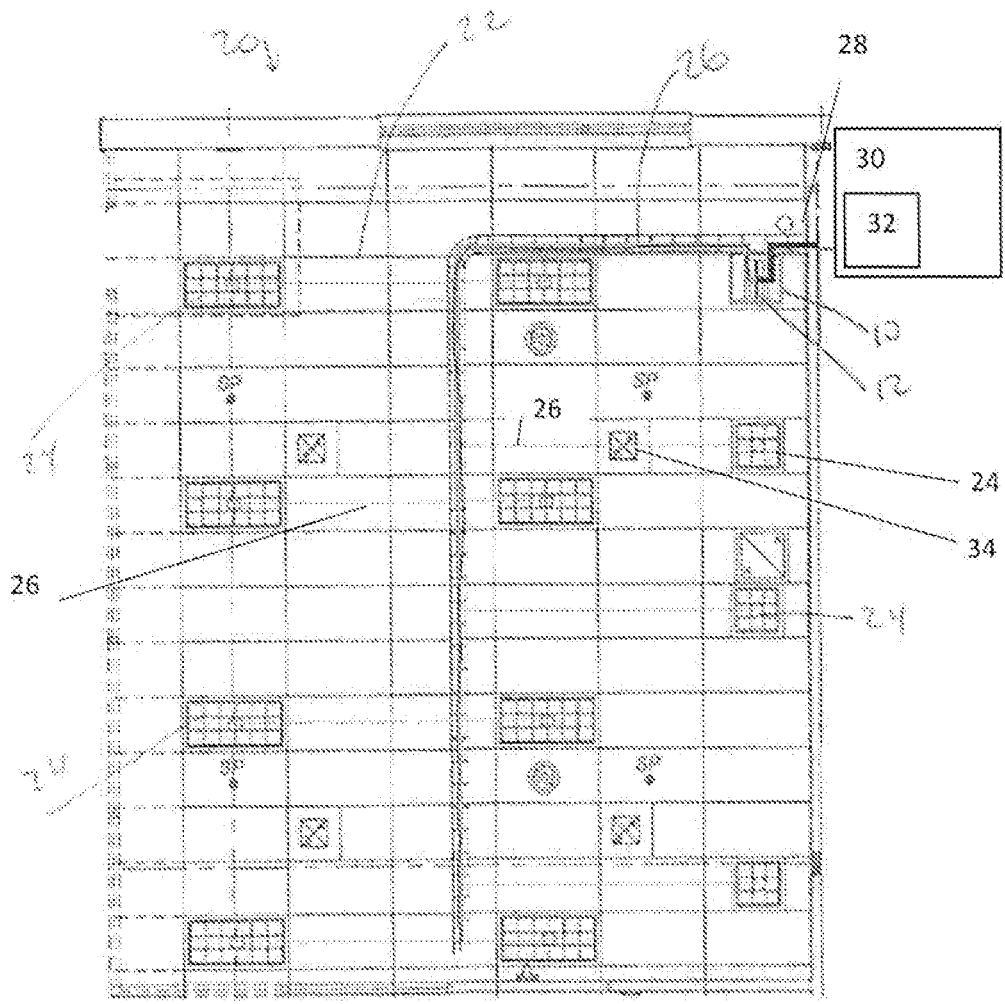

LIGHT FIXTURE WITH PATCH PANEL

FIELD OF THE INVENTION

This application relates to a patch panel for PoE (Power over Ethernet) applications. More particularly, this application relates to a patch panel for PoE (Power over Ethernet) applications implemented in light fixtures.

DESCRIPTION OF RELATED ART

In the communication industry a "rack" is a frame, cabinet or other structure that supports various interconnectivity components within a data network. One common interconnectivity component in a data communication network is a patch panel. See for example prior art FIG. 1. These patch panels, arranged within the racks, are used to provide a connection structure with a plurality of connection ports (i.e. openings for receiving cable connectors) where fiber optic or copper cable segments of a communication pathway are connected. It is common to have an arrangement including one or more racks and patch panels within a data communication cable network to provide flexibility when arrangement communication equipment, changing, upgrading or replacing equipment.

One use of the rack/patch panels is to support PoE (Power over Ethernet) connections for providing common signal/power communication channels over twisted pair LAN cables. One application of PoE is to provide power and signal control for modern "smart" light fixtures/lighting systems. Advancements in remotely controlled and monitored smart lighting systems use PoE cabling arrangements and the related rack/patch panel infrastructure to support the lighting connectivity.

As the market for PoE lighting is increasing and one of the challenges associated with it is how to manage the category PoE cables that are being used to provide data and/or power to the light fixtures. One common method for accomplishing this PoE cabling is to use a topology commonly referred to as 'zone distribution.' This method has been around prior to the advent of PoE lighting and is often recommended for dense wireless access point deployments.

Historically a zone distribution or zone cabling topology involves an enclosure containing patch panels, such as that shown in FIG. 1, mounted in the ceiling. This ceiling mounted patch panel would connect on one side with the many smart lights (or other PoE powered devices) in the room, each with its own PoE cable. The other side of the patch panel would be connected with horizontal cables that connect it back to the main IDF (Intermediate Distribution Frame) or closet that manages the smart lighting system. The addition of this ceiling mounted patch panel presents an additional cost to the building owner when installing smart lighting systems.

For example, this prior art solution involves a zone distribution box that is often located above a ceiling tile. This extra box requires extra installation time, material cost and, if it is plenum rated, additional certification costs. Also, since it is 'hidden' for aesthetic reasons, it can be hard to locate when physical changes to the network are required.

OBJECTS AND SUMMARY

The present arrangement is directed to a patch panel, such as for use in a PoE lighting arrangement, where the patch panel is located and affixed to an existing style light fixture. For example, in one embodiment, the present arrangement includes a light fixture, typically, but not limited to, a troffer style fixture, with a permanently attached or field-attachable patch panel for accepting and/or distributing four pair LAN/PoE cables or single pair cables for traditional networks (e.g. BASE-T ethernet) or emerging single-pair ethernet cables.

To this end a lighting system is provided with a plurality of light fixtures within a room and at least one control system for controlling the plurality of light fixtures within a room. At least one of the light fixtures among the plurality of light fixtures within the room includes a patch panel thereon, the control system attached to the patch panel on a first side of the patch panel, and where a remaining of the plurality of light fixtures in the room are connected to the patch panel on a second side.

BRIEF DESCRIPTION OF THE DRAWINGS

FIGS. 2A and 2B illustrate a prior art troffer style light fixture;
FIGS. 3A and 3B illustrate a troffer style light fixture with a patch panel in accordance with one embodiment;
and
FIG. 4 illustrates an exemplary grid with multiple light fixtures in accordance with one embodiment.

DETAILED DESCRIPTION

Figure 1:
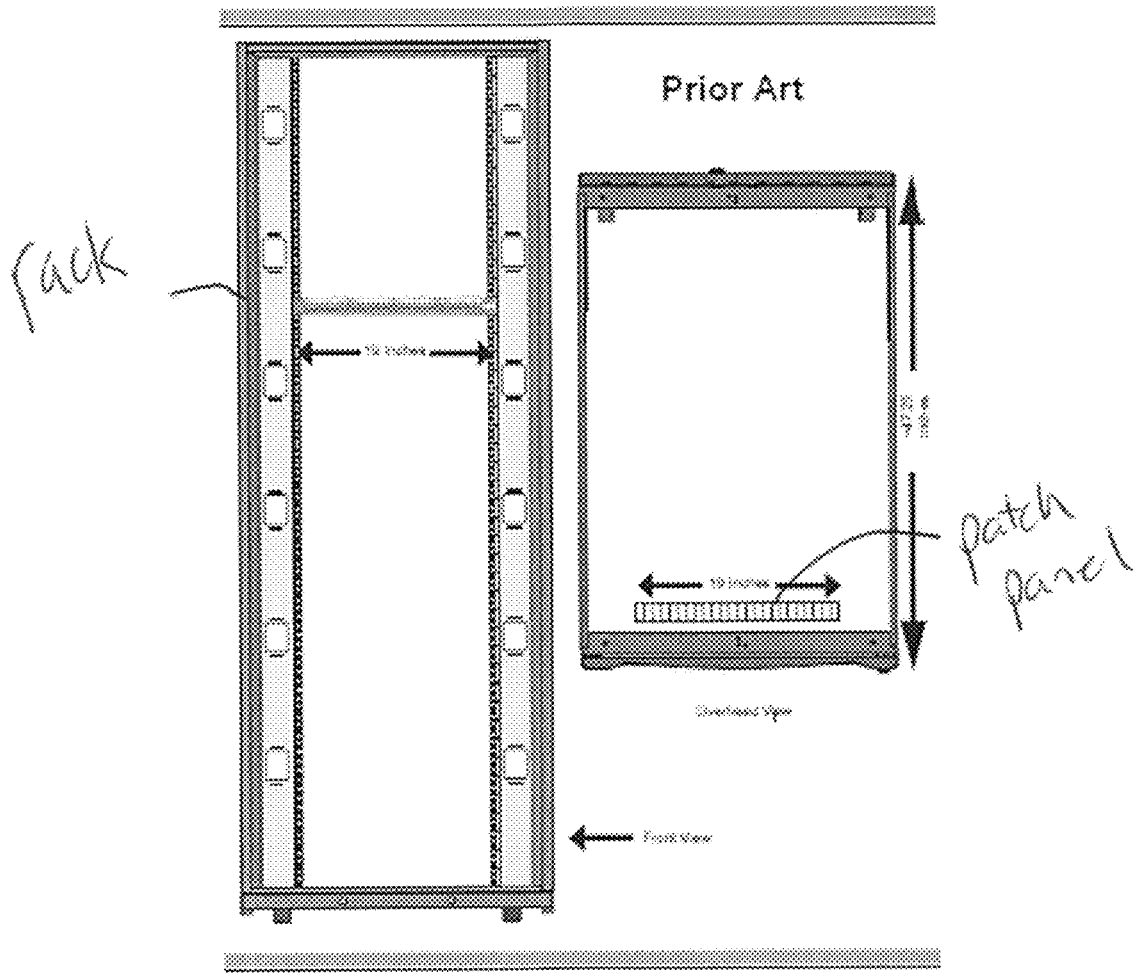
FIG. 1 is a prior art rack and patch panel.

In one embodiment as shown in prior art FIGS. 2A and 2B, a troffer style light fixture is shown, common in industrial or commercial settings. FIG. 2A is a side view and FIG. 2B is a top view of the same troffer fixture. In the prior art, in smart lighting system, each such fixture would need to be connected independently, by a PoE cable to the ceiling mounted patch panel, for ultimate connections to the light system management system.

In one embodiment of the present invention as shown in FIGS. 3A and 3B, a troffer style light fixture 10 is shown having a patch panel 12 thereon. Such patch panel 12 may be integrally formed or be field attachable to the top of fixture 10.

In one exemplary embodiment, troffer fixture 10 is of the type that sits in the ceiling grid of a suspended ceiling system. In the U.S., these troffer fixtures are typically 2'×2', 4'×2' or 4'×4' (noted that a 2'×2' fixture is usually dimensioned at is 23.70" by 23.70" to allow for fixture 10 to fit in the support grid. Such fixture 10 could be configured to be hinged for easy swing/drop down for access to its top side. Other arrangements are also within the contemplation of the present arrangement such as including patch panel 12 into other style light fixtures such as bar light, which is typically thinner than its length (eg 6"×4'). Depending on how the installed HVAC (Heating Ventilation and Air Conditioning) system is ducted, the ceiling space above a drop ceiling may or may not be considered a plenum. If so, fixture 10 and patch panel 12 may be likewise rated for such an environment. Alternatively, patch panel 12 could be implemented on any light fixture large enough to support it, including high bay lights for warehouse or other large space applications.

In one embodiment as shown in FIGS. 3A and 3B, patch panel 12 can be an ordinary patch panel that supports both 4-pair and 1-pair ethernet applications and can be designed to use a panel that accepts snap-in jacks, and/or printed circuit boards with several jacks utilizing insulation displacement connectors (IDC) or 110 style punch down blocks.

For example, a typical patch panel 12 is 19 in. wide and 1, 2, 4 or more rack units (U) high (1U=1.75 in.). The depth from front to back varies depending on factors such as whether it accepts snap-in jacks or provides for cable management on the front and/or back. In the present arrangement, patch panel 12 is linear or angled (or of other shapes as required). If patch panel 12 is an ordinary panel, it will accept 24 ports in each U of space. It is contemplated that patch panel 12 may be of standard 19×1U etc. . . . or it can be customized in size for additional ports as required by the PoE light system being supported.

In one embodiment, patch panel 12 is modified, compared to prior art patch panels for mounting on the top of fixtures 10. Typical patch panels have vertical mounting ears on each side that are screwed into the support posts of the telecommunications rack in the closet (e.g. See FIG. 1). These mounting ears are not required on panel 12 in the present application. However, a bottom surface 13 of patch panel 12, shown in FIG. 3A is directly attached to the top of the light fixture or suspended a few millimeters above it via standoffs (not shown). As noted above, the physical size of exemplary RJ45 plugs (used for PoE applications allow for 24 ports to fit in typical prior art 1U×19" patch panel. However, as fixture 10 is usually longer than 19," the number of jack connections for panel 12 can be increased. In one example, jacks 15 can be arranged in parallel rows on the top of the fixture, increasing the number in the same footprint or they can be simply arranged in a linear arrangement, depending on the design requirements. Optionally, patch panel 12 may have a cover to obtain the required rating for plenum spaces.

It is noted that most troffer style lights simply drop into the ceiling grid and are supported by it around the edges and are also attached to the building structure via a safety wire that would prevent them from falling if the ceiling grid failed for some reason. In the present arrangement to accommodate panel 12, as noted above, part of light fixture 10 can be optionally lowered down via a hinge on one side. For this arrangement any safety wires either have to be long enough to allow for the panel 12 to be lowered or attached to a point on fixture 10 that isn't required to move. In another embodiment, the top of fixture 10 may also be modified to include cable management components such as tie-down points or channels for routing cables, or be outfitted with grounding connection points as needed.

Turning now to an implementation of fixture 10, with patch panel 12, FIG. 4 shows an exemplary room 20 with a drop ceiling grid 22. In the room there are 12 separate smart light fixtures 24, each of which is intended to be powered, for example by a PoE cable 26 that ultimately must be connected with a control system 32 located in a telecommunications closest 30. At least one additional non-light device 34 may be connected with the patch panel 12 for management by the control system 32. Instead of being coupled directly to the equipment in closet 30, a fixture 10 with patch panel 12 is located at a position close to cabinet 30 so that a short coupling cable 28 may be passed into a front side of panel 12 from closet 30. This way, PoE cables 26, instead of being connected with the closet/system 30 directly, they are instead connected with the back end of panel 12 on fixture 12 located inside the room. Such cables 26 can be passed from panel 12 with J-hooks through grid 22. Cables 26 connected to fixtures 24, from fixture 10 could be patch cords or additional lengths of horizontal cable terminated in the field with RJ-45 connectors.

Such an arrangement allows for the connection for each light fixture 24 in the room is easily accessibly from the top of fixture 10 rather than closet 30. When physical reconfigurations of lights 24 are required within grid 22/room 20, instead of needing to access control closet 30, the PoE management connections can be corrected and adjusted directly from panel 12 in fixture 10.

What is claimed is:

1. A lighting system, said system comprising:
a plurality of troffer style light fixtures within a room;
at least one control system for controlling said plurality of troffer style light fixtures within a room;
wherein said control system is a PoE light management system, and said troffer style light fixtures are PoE lights; and
wherein at least one of said troffer style light fixtures among said plurality of troffer style light fixtures within said room, said at least one troffer style light fixture having width and length, the length being the long axis, said at least one troffer style light fixture includes a multi-port patch panel sufficient to support a plurality of RJ45 connections ports within one rack unit (RU) thereon and arranged along said long axis of said at least one troffer style light fixture, said patch panel being a passive network device allowing physical reconfiguration of networking segments including said PoE troffer style light fixtures,
said control system coupled to said multi-port patch panel from a first side of said multi-port patch panel by a single PoE coupling cable, and wherein a plurality among said remaining troffer style light fixtures in said room are each connected to one of said plurality of RJ45 connection ports of said multi-port patch panel from a second side by at least another plurality of PoE cables, one for each of said plurality among said remaining troffer style light fixtures.

2. The lighting system as claimed in claim 1, further comprising at least one non-light device for connection with said multi-port patch panel and management by said control system.

* * * * *